(12) United States Patent
Wu et al.

(10) Patent No.: US 9,442,152 B2
(45) Date of Patent: Sep. 13, 2016

(54) FAULT LOCATION SYSTEM AND METHOD FOR DISTRIBUTION NETWORK

(71) Applicant: General Electric Company, Schenectady, NY (US)

(72) Inventors: Zhilin Wu, ShangHai (CN); Ilia Voloh, Thornhill (CA); Lihan He, Shanghai (CN); Zhihan Xu, Richmond Hill (CA)

(73) Assignee: GENERAL ELECTRIC COMPANY, Schenectady, NY (US)

(*) Notice: Subject to any disclaimer, the term of this patent is extended or adjusted under 35 U.S.C. 154(b) by 33 days.

(21) Appl. No.: 14/458,350

(22) Filed: Aug. 13, 2014

(65) Prior Publication Data

US 2015/0048841 A1 Feb. 19, 2015

(30) Foreign Application Priority Data

Aug. 15, 2013 (CN) .......................... 2013 1 0356104

(51) Int. Cl.
*G01R 31/08* (2006.01)

(52) U.S. Cl.
CPC ............ *G01R 31/086* (2013.01); *Y04S 10/522* (2013.01)

(58) Field of Classification Search
CPC .. G01R 31/02; G01R 31/024; G01R 31/025; G01R 31/08; G01R 31/085; G01R 31/086; G01R 19/2513; G01R 27/16; H04B 3/46
USPC ......... 324/512, 522, 525, 555; 361/65, 93.1; 702/59, 183, 185
See application file for complete search history.

(56) References Cited

U.S. PATENT DOCUMENTS

| | | | | |
|---|---|---|---|---|
| 5,243,293 A * | 9/1993 | Isozaki | ................ | G01R 15/246 324/244.1 |
| 5,446,387 A * | 8/1995 | Eriksson | .............. | G01R 31/085 324/522 |
| 5,839,093 A * | 11/1998 | Novosel | ............... | G01R 31/086 324/525 |
| 6,002,260 A * | 12/1999 | Lau | ...................... | G01R 15/142 324/509 |
| 6,133,724 A * | 10/2000 | Schweitzer, Jr. | .... | G01R 31/021 324/133 |
| 6,154,036 A * | 11/2000 | Baldwin | .............. | G01R 31/086 324/509 |

(Continued)

FOREIGN PATENT DOCUMENTS

| | | | | |
|---|---|---|---|---|
| IN | WO 2012049294 A1 * | 4/2012 | ............. | H02H 3/081 |
| WO | 9742514 A1 | 11/1997 | | |
| WO | 2009081215 A2 | 7/2009 | | |

OTHER PUBLICATIONS

Tang et al., A Practical On-Line Condition Monitoring and Fault Location System for Overhead Power Lines Distribution Networks, Inhand Networks, 2014, IEEE.*

(Continued)

*Primary Examiner* — Jermele M Hollington
*Assistant Examiner* — Sean Curtis
(74) *Attorney, Agent, or Firm* — GE Global Patent Operation; Catherine J. Toppin

(57) ABSTRACT

A fault location system for a distribution network is disclosed. The fault location system includes at least one sensor and a fault location evaluation apparatus. The at least one sensor is located on the distribution network, for sensing current and dividing the distribution network into at least two regions. The fault location evaluation apparatus includes a fault region determination unit for determining which one of the at least two regions is a fault region where a fault occurs therein by calculating the sensed current from the at least one sensor.

10 Claims, 18 Drawing Sheets

(56) References Cited

U.S. PATENT DOCUMENTS

| | | | | |
|---|---|---|---|---|
| 6,249,230 | B1* | 6/2001 | Baldwin | H02H 3/042 340/650 |
| 6,367,742 | B1 | 4/2002 | Ireland | |
| 6,907,321 | B2* | 6/2005 | Kearney | H02H 7/266 700/292 |
| 7,180,300 | B2* | 2/2007 | Premerlani | G01R 31/086 324/509 |
| 8,558,551 | B2* | 10/2013 | Mynam | G01R 31/086 324/522 |
| 8,810,251 | B2* | 8/2014 | Koliwad | G01R 31/086 324/522 |
| 8,908,343 | B2* | 12/2014 | Pan | H02H 3/305 361/84 |
| 2003/0085715 | A1* | 5/2003 | Lubkeman | G01R 31/086 324/509 |
| 2004/0189317 | A1* | 9/2004 | Borchert | G01R 31/3275 324/512 |
| 2005/0040809 | A1* | 2/2005 | Uber, III | G01R 15/142 324/117 R |
| 2008/0211511 | A1* | 9/2008 | Choi | G01R 31/086 324/522 |
| 2010/0225329 | A1* | 9/2010 | Akke | H02H 3/402 324/525 |
| 2011/0031977 | A1* | 2/2011 | O'Sullivan | G01R 31/088 324/522 |
| 2012/0113555 | A1* | 5/2012 | Mousavi | H02H 3/066 361/78 |
| 2013/0049764 | A1* | 2/2013 | Koliwad | G01R 31/086 324/522 |
| 2013/0141827 | A1* | 6/2013 | Ukil | H02H 3/081 361/85 |
| 2013/0221977 | A1* | 8/2013 | Ukil | G01R 31/08 324/522 |
| 2013/0286521 | A1* | 10/2013 | Park | H02H 7/268 361/57 |
| 2013/0325402 | A1* | 12/2013 | Vukojevic | H02J 13/001 702/181 |

OTHER PUBLICATIONS

Borghetti et al., Assessment of Fault Location in Power Distribution Networks, Electrical Power Quality and Utilisation, Journal. vol. XIII, No. 1, 2007.*

Abido et al., Fault Location Based on Synchronized Measurements: A Comprehensive Survey, The Scientific World Journal, 2014.*

Hao et al., The Fault Location Method of Distribution Network with Fault Indicators Based on Impedance, International Conference on Automation, Mechanical Control and Computational Engineering (AMCCE 2015).*

European Search Report and Written Opinion issued in connection with corresponding EP Application No. 14180546.5-1560 dated Jan. 22, 2015.

Nordman et al., "Design of a concept and a wireless ASIC sensor for locating Earth faults in unearthed electrical distribution networks", IEEE Transactions on Power Delivery, IEEE Service Center, vol. 21, Issue No. 3, pp. 1074-1082, Jul. 1, 2006.

Ebron et al., "A Neural Network Approach to the Detection of Incipient Faults on Power Distribution Feeders", Power Delivery, IEEE Transactions on vol. 5, Issue: 2, pp. 905-914, Apr. 1990.

Zhao et al., "Design and Evaluation of a Directional Relay for Use Within a Distribution Network Restoration Scheme", Power Engineering Society Winter Meeting, 2000, IEEE (vol. 4), pp. 2374-2378, Jan. 2000.

Shivaz, "Sustained and Incipient Fault Location for Utility Distribution System", MS Thesis—The University of Texas at Austin, pp. 1-115, Dec. 2009.

* cited by examiner

FAULT LOCATION SYSTEM AND METHOD FOR DISTRIBUTION NETWORK

BACKGROUND

Embodiments of the invention relate generally to systems and methods for locating faults in electrical power systems, and in particular, to a system and a method for determining fault locations in a distribution network.

Accurate fault location is an essential technology that enables utility companies in maintaining service reliability to reduce system average interruption duration index (SAIDI). When a fault such as, for example, a short-circuit fault, occurs, immediate actions have to be taken to reduce the impacted areas. However, in a distribution network, one major challenge is that the distribution network has a large number of distribution line laterals/branches and distributed loads. In such a scenario, the application of traditional fault location methods, such as impedance based methods, cannot achieve a similar accuracy for the distribution network as for the transmission network.

Therefore, it is desirable to provide systems and methods to address the above-mentioned problems.

BRIEF DESCRIPTION

In accordance with one embodiment disclosed herein, a fault location system for a distribution network is provided. The fault location system includes at least one sensor and a fault location evaluation apparatus. The at least one sensor is located on the distribution network, for sensing current and dividing the distribution network into at least two regions. The fault location evaluation apparatus includes a fault region determination unit for determining which one of the at least two regions is a fault region where a fault occurs therein by calculating the sensed current from the at least one sensor.

In accordance with another embodiment disclosed herein, a fault location system for a distribution network is provided. The fault location system includes at least one sensor and a fault location evaluation apparatus including a line section selecting unit, a line section classification unit, a fault location parameter calculation unit, and a fault location candidate record unit. The at least one sensor is located on the distribution network, for sensing current and voltage. The line section selecting unit is for selecting line sections one by one in the distribution network. The line section classification unit is for classifying each of the selected line sections into a corresponding equivalent fault model. The fault location parameter calculation unit is for calculating a fault distance 'D' and a fault resistance '$R_F$' of an assumed fault point of each of the selected line sections based on the corresponding equivalent fault model. The fault location candidate record unit is for recording the assumed fault points as fault location candidates if $R_F \geq 0$ and $0 \leq D \leq D_T$, wherein '$D_T$' is the total length of the corresponding line section.

In accordance with yet another embodiment disclosed herein, a fault location method for a distribution network is provided. The fault location method includes sensing current on at least one position of the distribution network; dividing the distribution network into at least two regions based on the at least one position; and determining which one of the at least two regions is a fault region where a fault occurs therein by calculating the sensed current on the at least one position.

DRAWINGS

These and other features, aspects, and advantages of the present disclosure will become better understood when the following detailed description is read with reference to the accompanying drawings in which like characters represent like parts throughout the drawings, wherein.

FIGS. 7, 8, 9, 10, 11, 12, 13, and 14 are equivalent diagrams of eight equivalent fault models.

Figure 6:
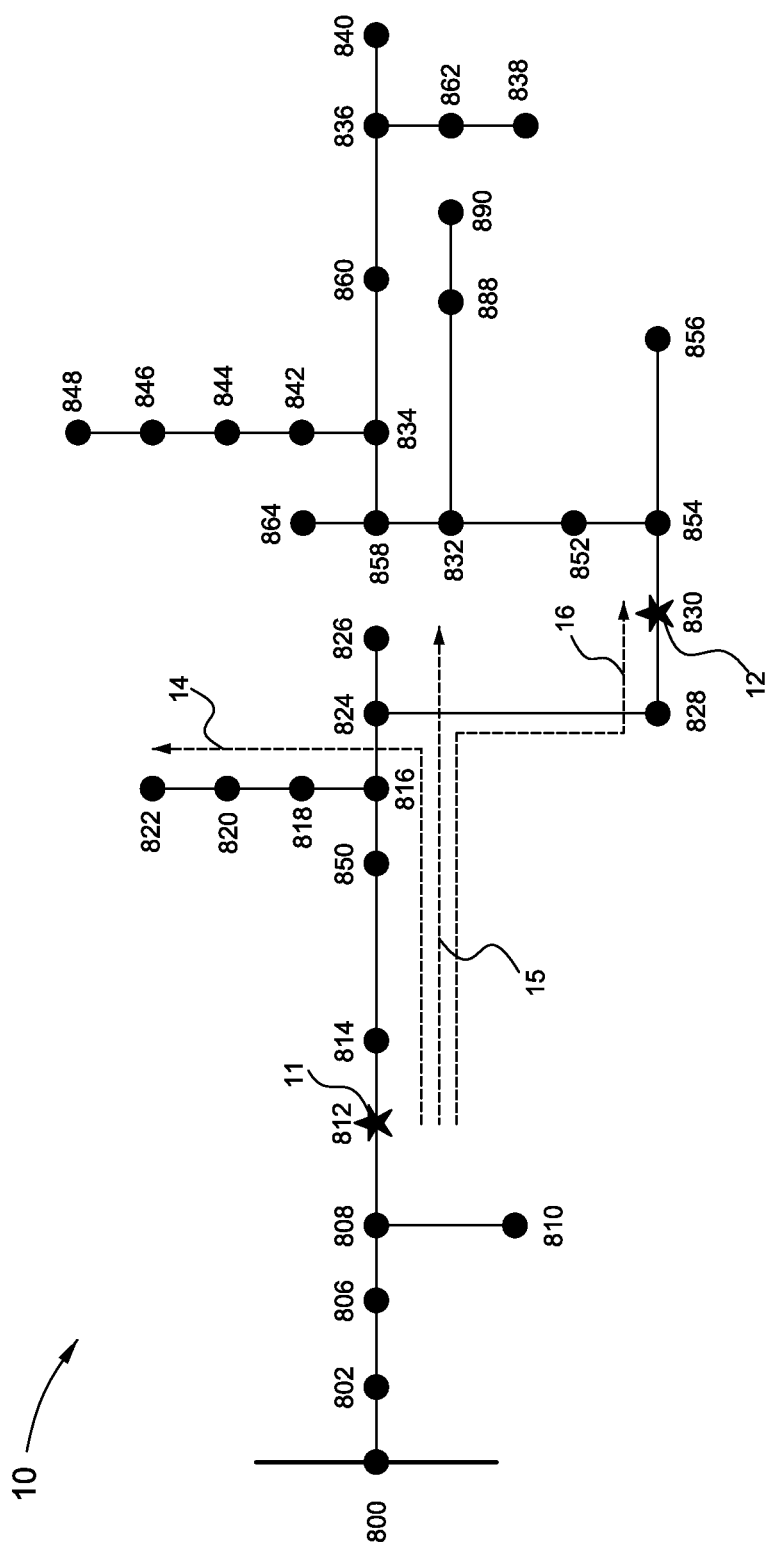
FIG. 6 is a schematic diagram of showing three PPFPs in the fault region of FIG. 3.
Figure 7:
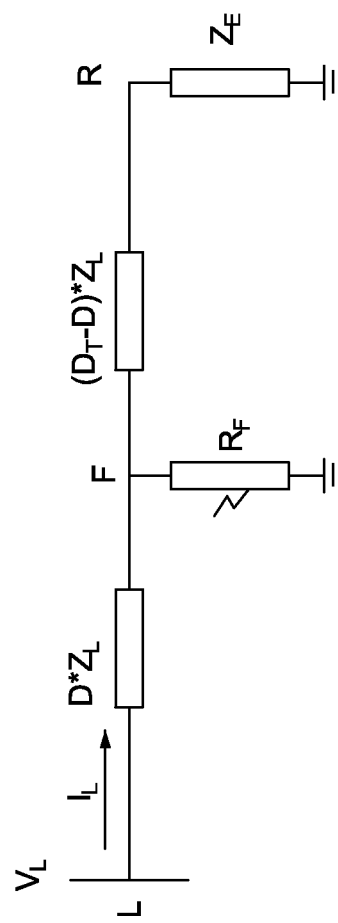
Figure 8:
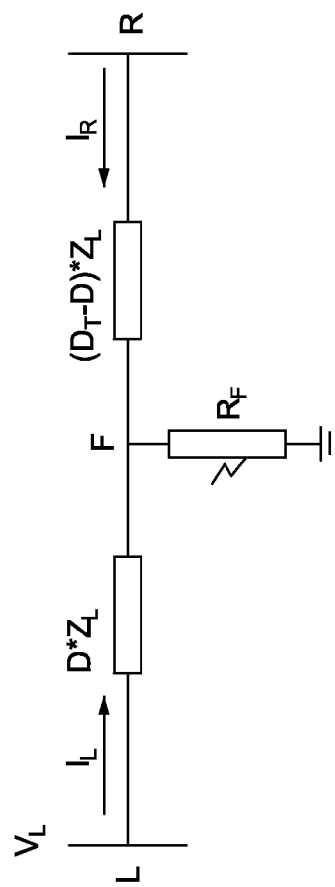
Figure 9:
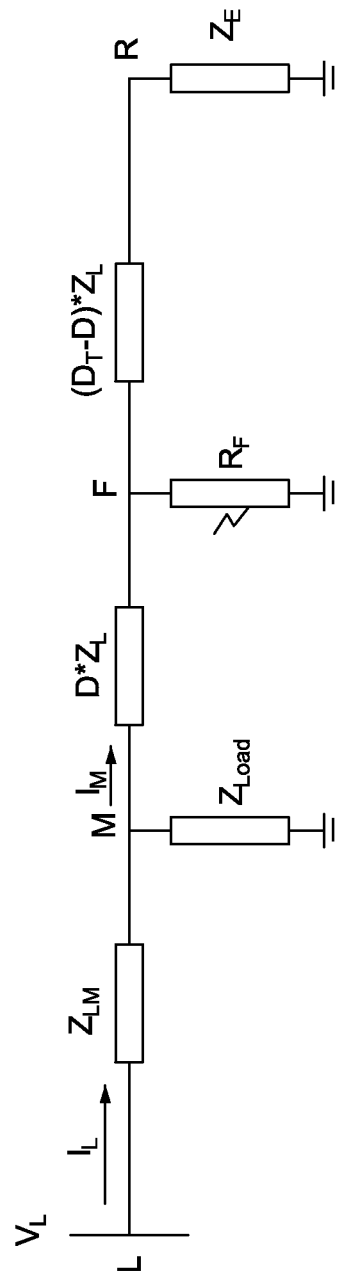
Figure 10:
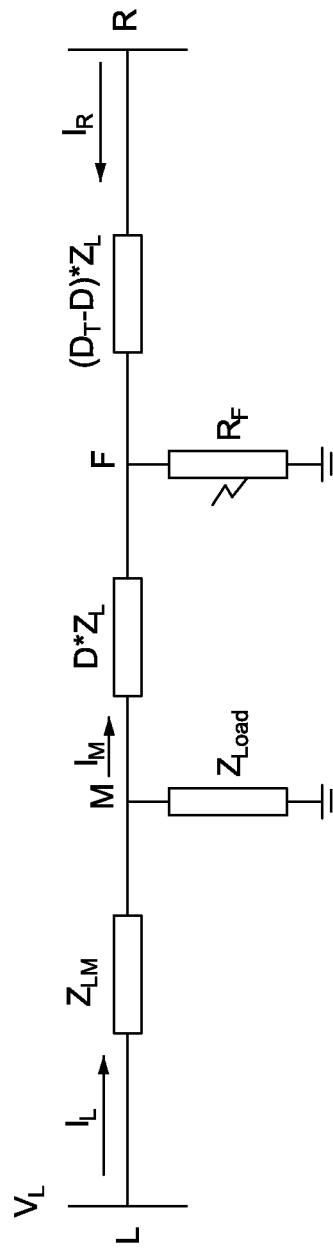
Figure 11:
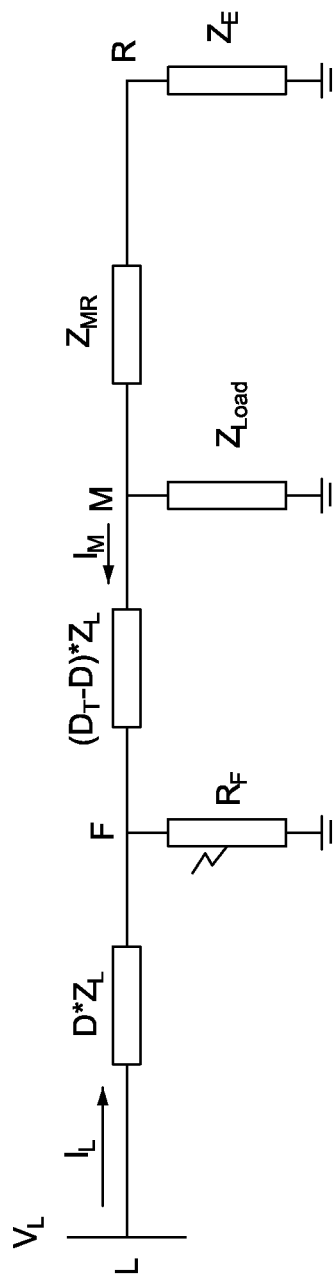
Figure 12:
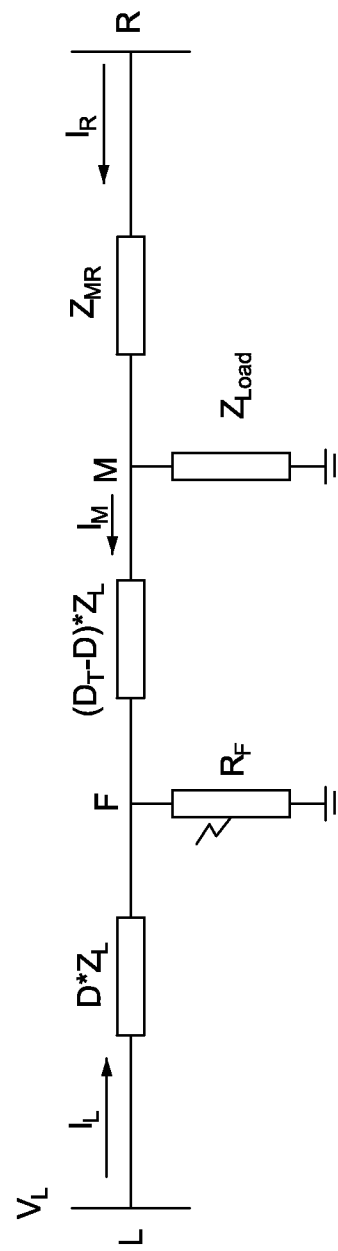
Figure 13:
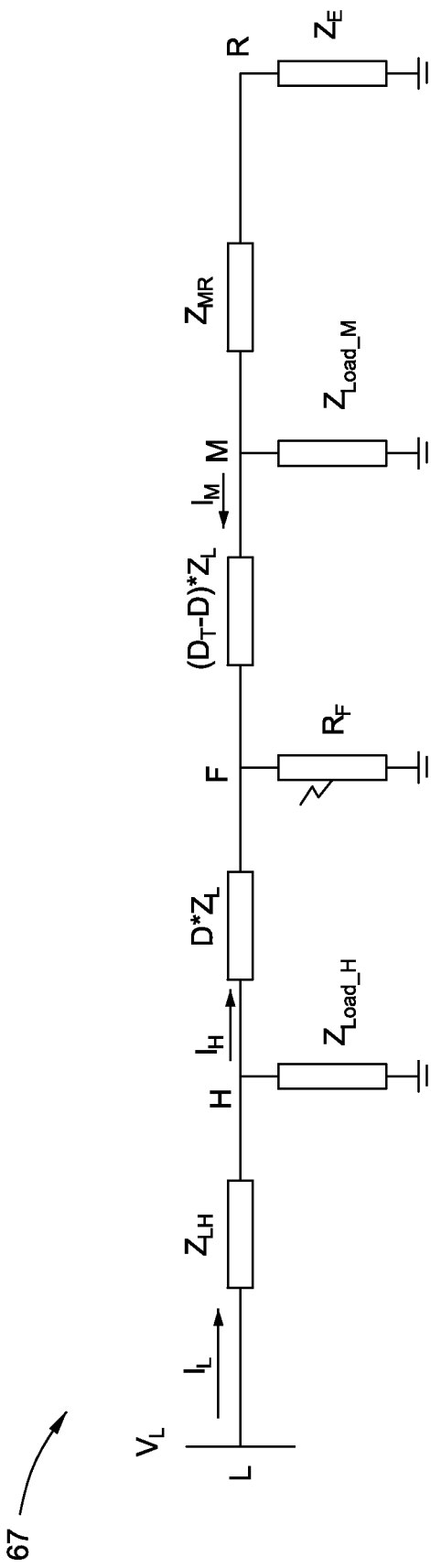
Figure 14:
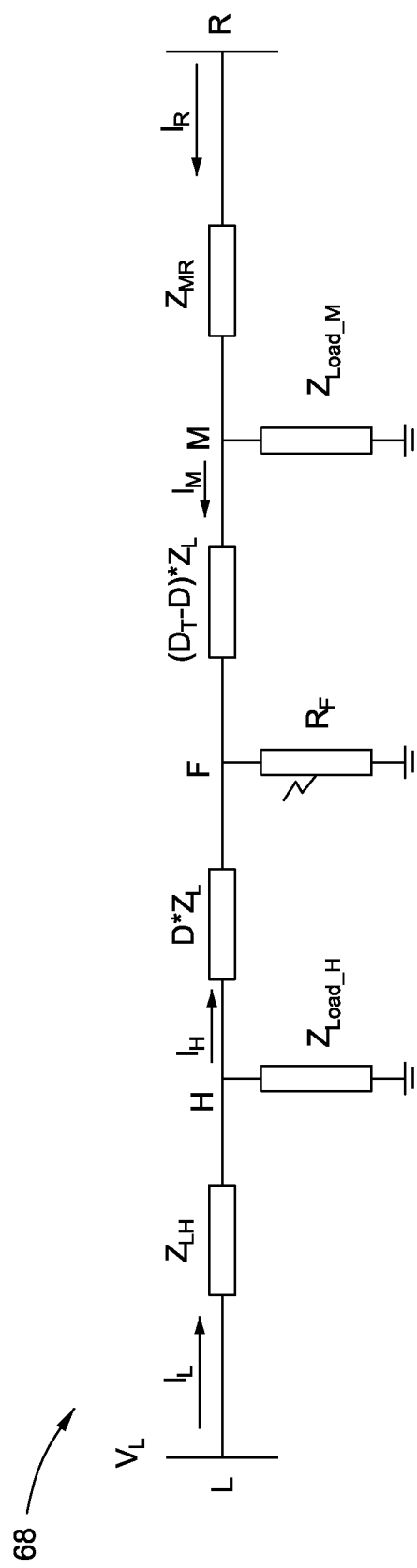
Figure 15:
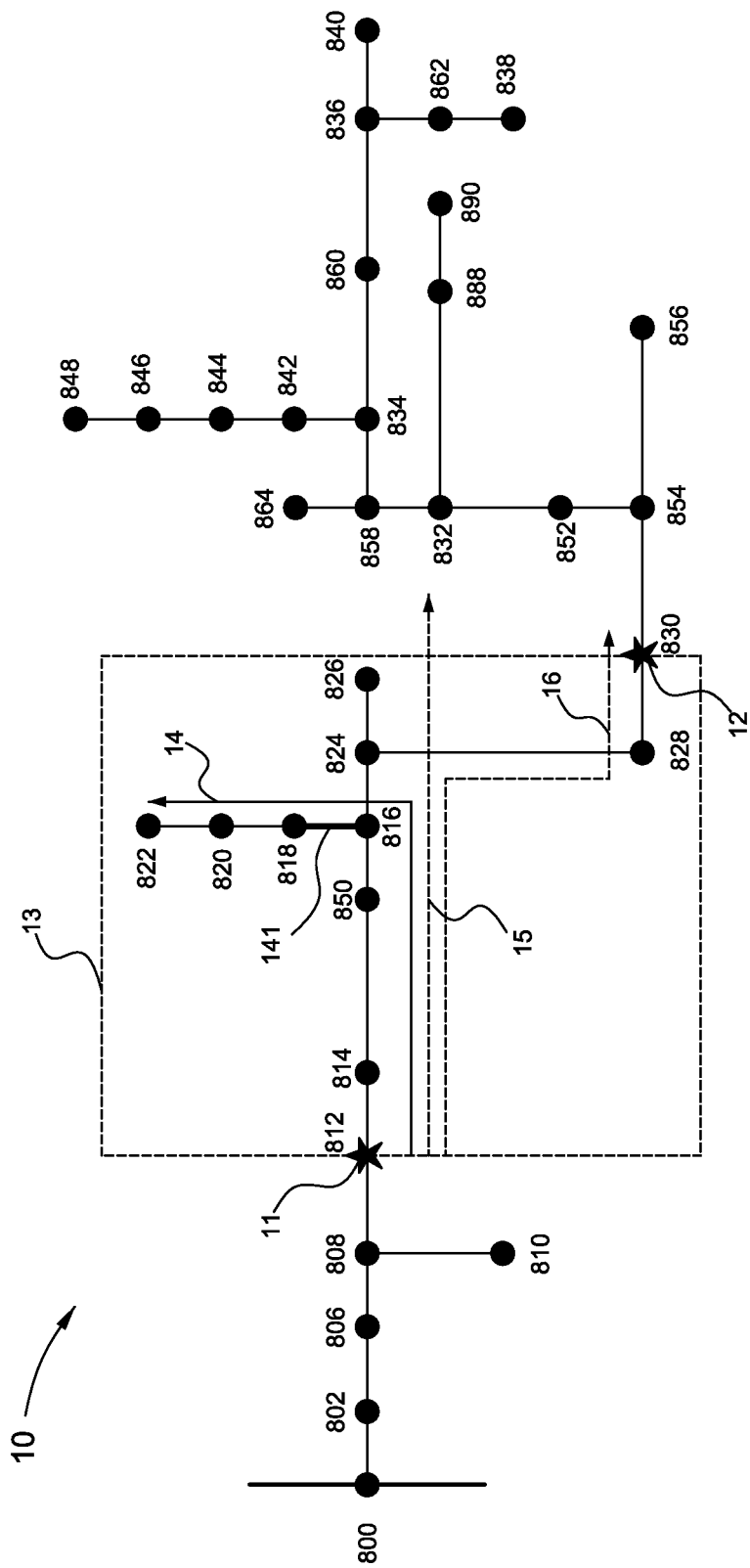

FIG. 15 is a schematic diagram of showing a line section of the fault region of the distribution network of FIG. 6.

Figure 16:
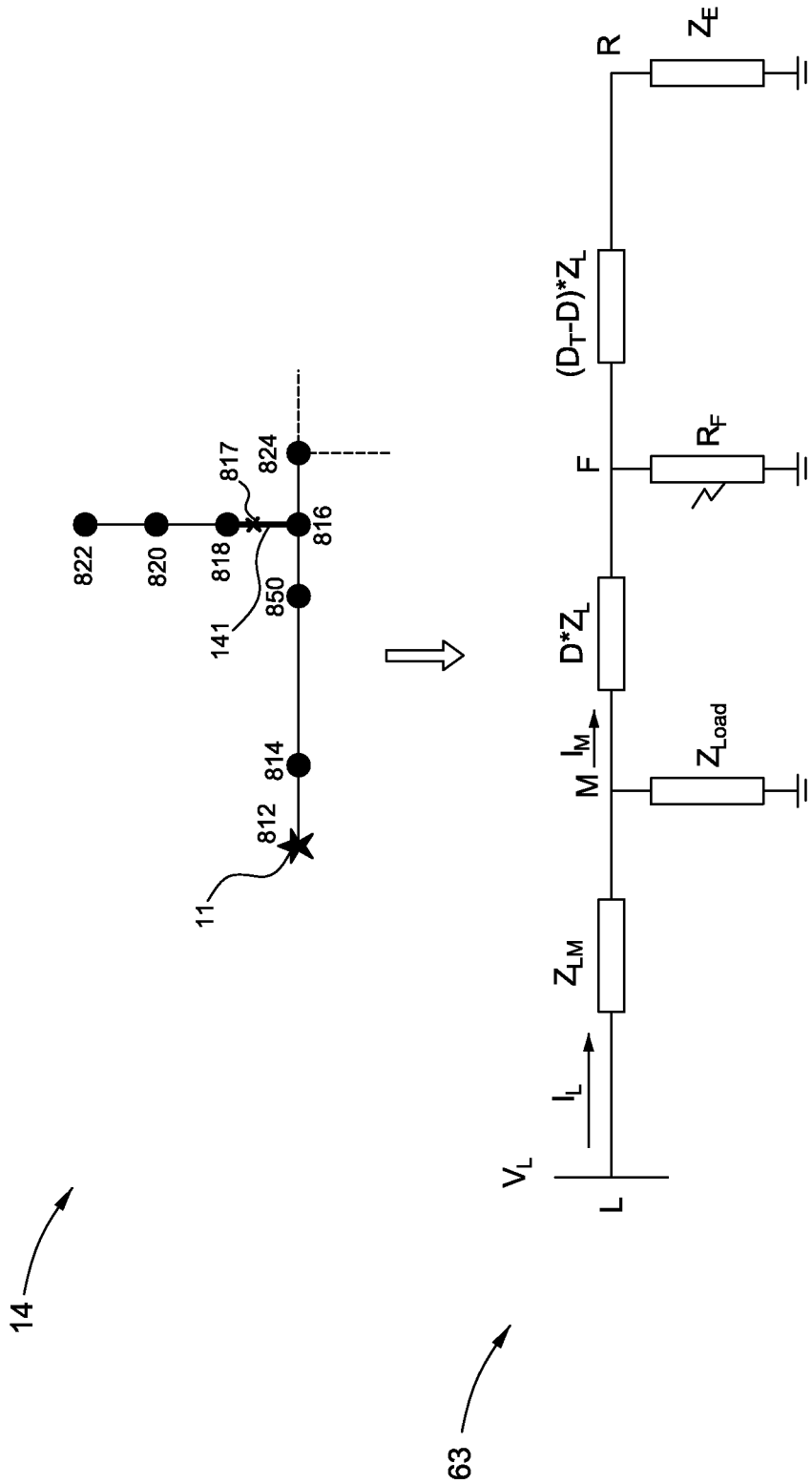

FIG. 16 is a schematic diagram of showing a classification process of classifying a line section into a corresponding equivalent fault model.

Figure 17:
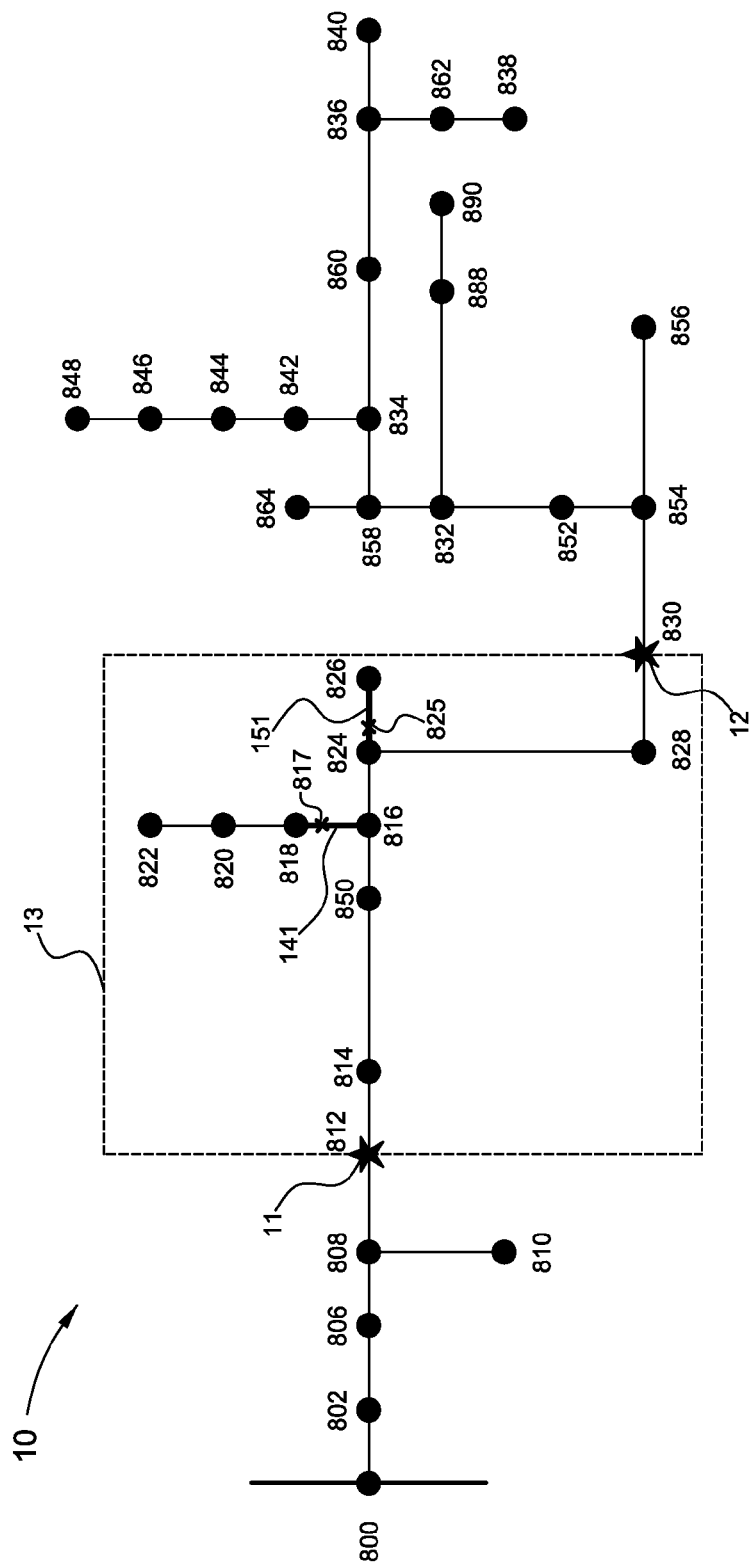

FIG. 17 is a schematic diagram of showing two fault location candidates of the fault region of the distribution network of FIG. 6.

Figure 2:
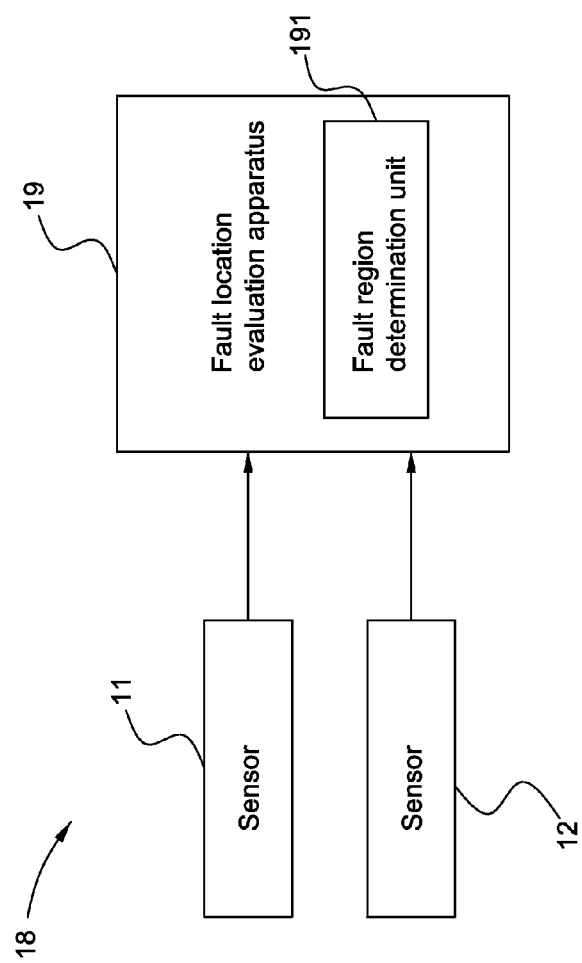
FIG. 2 is a block diagram of a fault location system of the distribution network of FIG. 1, in accordance with an exemplary embodiment of the present disclosure.
Figure 18:
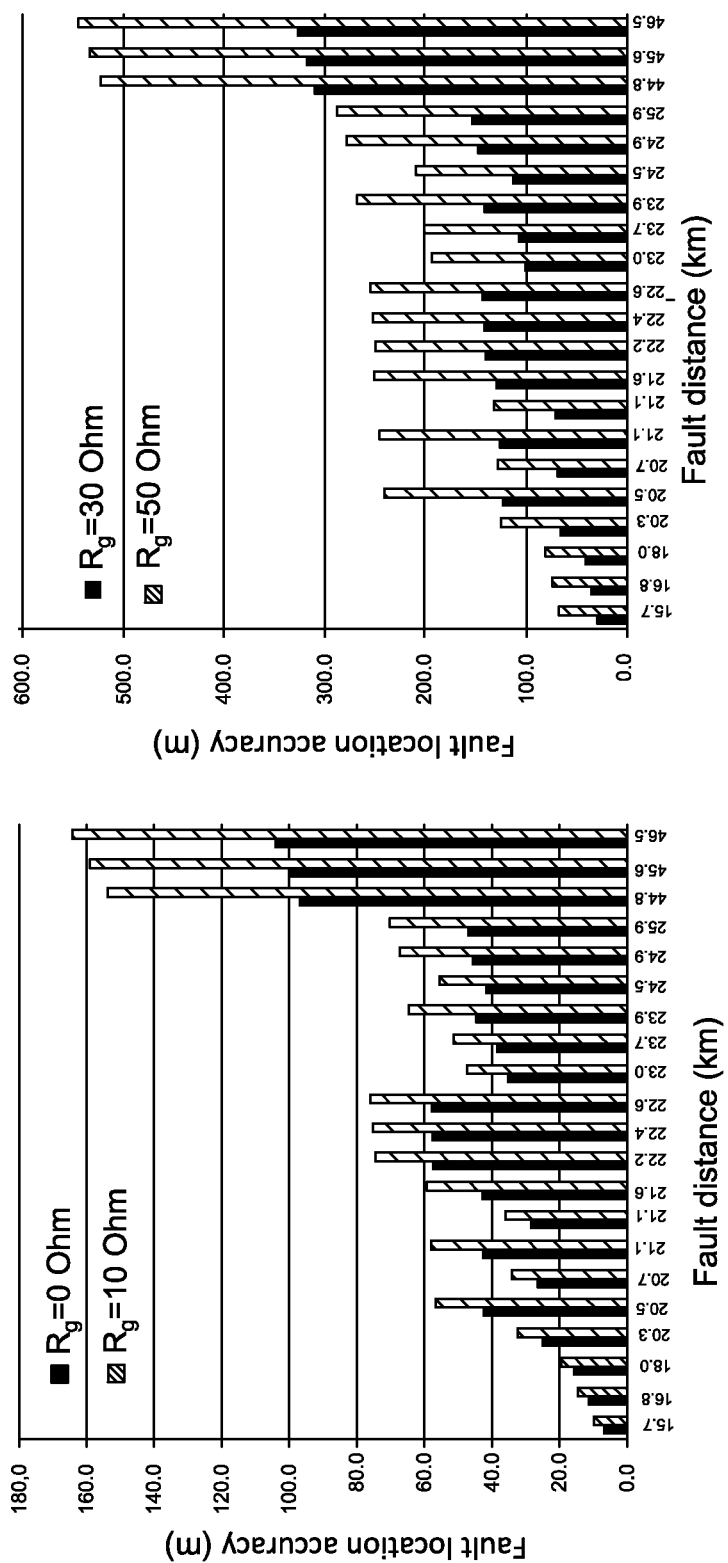

FIG. 18 is a simulation diagram of showing distance accuracy of the fault location system of FIG. 2 under four different fault resistances.

DETAILED DESCRIPTION

Embodiments disclosed herein relate generally to a fault location system and a fault location method having fault location candidate evaluation functions to evaluate fault possibilities in each line section, which can reduce the possible fault locations to only a few fault location candidates in the distribution network. Thus, the operators can easily determine the actual fault location from the few fault location candidates, or can maintain the distribution network just based on the few fault location candidates. This fault location system and fault location method may increase the efficiency on detecting fault points in a distribution network or other similar power networks.

The term "possible power flow path (PPFP)" as used herein refers to a possible path through which the current may flow from an upstream sensor to the end of a lateral or a downstream sensor in a fault region of a distribution network. The sensor in one embodiment comprises a current-voltage sensor used to sense current and voltage where the sensor located. The term "line section" is defined as a section between two adjacent nodes in a PPFP. The nodes in a PPFP are based on network structure. For example, the nodes may represent some apparatuses or electrical elements designed in the PPFP, such as substations, transformers, resistor elements, capacitor elements, transistor elements, or something else. Each PPFP may include several line sections depending on the number of the predetermined nodes. The number of the line sections is determined based on network structure as well.

One or more specific embodiments of the present disclosure will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Unless defined otherwise, technical and scientific terms used herein have the same meaning as is commonly understood by one of ordinary skill in the art to which this disclosure belongs. The terms "first", "second", and the like, as used herein do not denote any order, quantity, or importance, but rather are used to distinguish one element from another. Also, the terms "a" and "an" do not denote a limitation of quantity, but rather denote the presence of at least one of the referenced items. The term "or" is meant to be inclusive and mean either or all of the listed items. The use of "including," "comprising" or "having" and variations thereof herein are meant to encompass the items listed thereafter and equivalents thereof as well as additional items. The terms "connected" and "coupled" are not restricted to physical or mechanical connections or couplings, and can include electrical connections or couplings, whether direct or indirect. Furthermore, the terms "circuit" and "circuitry" and "controller" may include either a single component or a plurality of components, which are either active and/or passive and may be optionally be connected or otherwise coupled together to provide the described function.

Figure 1:
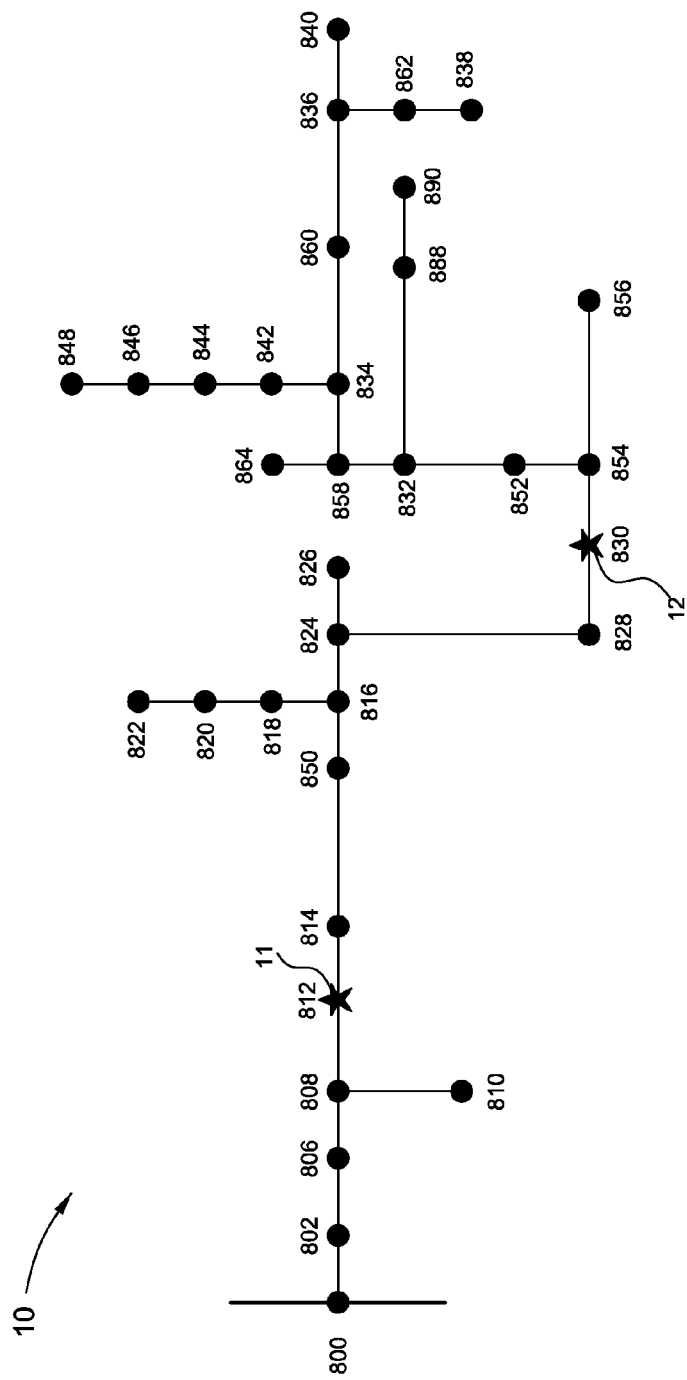
FIG. 1 is a schematic diagram of a distribution network in accordance with an exemplary embodiment of the present disclosure.

FIG. 1 illustrates a schematic diagram of a distribution network 10 in accordance with an exemplary embodiment of the present disclosure. For ease of illustration, the detailed configurations of the distribution network 10 are not shown in FIG. 1. The distribution network 10 may be used in urban power grids and rural power grids, as well as other types of power systems.

In the illustrated embodiment of FIG. 1, the distribution network 10 may include a main stream (nodes 800, 802, 806, 808, 812, 814, 850, 816, 824, 828, 830, 854, 852, 832, 858, 834, 860, 836, 840), and several laterals (such as a lateral from node 808 to node 810, a lateral of nodes 816, 818, 820, 822, a lateral from node 824 to node 826, a lateral from node 854 to 856, a lateral of nodes 832, 888, 890, a lateral from node 858 to node 864, a lateral of nodes 834, 842, 844, 846, 848, and a lateral of nodes 836, 862, and 838). Referring to FIG. 1 and FIG. 2 together, the distribution network 10 further includes a fault location system 18 having two current-voltage sensors 11, 12, and a fault location evaluation apparatus 19. The fault location evaluation apparatus 19 can be any types of data processing apparatus, such as a computer, a micro control unit (MCU), a digital signal processor (DSP), or any other appropriate controller or programmable device, etc. The fault location evaluation apparatus 19 may comprise an individual apparatus arranged in an appropriate position of the distribution network 10 or may comprise a calculation unit embedded in a related control apparatus of the distribution network 10, for example.

In this illustrated embodiment of FIG. 1, the current-voltage sensor 11 is installed on the node 812 of the main stream, and the current-voltage sensor 12 is installed on the node 830 of the main stream as an example. In other embodiments, the sensors 11 and 12 can be installed in any appropriate positions on the distribution network 10. For example, the sensor 11 may be installed between the node 812 and the node 814 and the sensor 12 may be installed between the node 828 and the node 830. The number and positions of the current-voltage sensors can be adjusted according to needs for sensing current and voltage flowing through the distribution network.

The distribution network 10 can thus be divided into several regions by the current-voltage sensors. For example, the distribution network 10 in FIG. 1 is divided into three regions by the two current-voltage sensors 11 and 12. Namely, one region is from node 800 to the current-voltage sensor 11 (node 812), one region is from the current-voltage sensor 11 to the current-voltage sensor 12 (node 830), and one region is from the current-voltage sensor 12 to node 840. In some embodiments, the distribution network 11 is evenly divided into several regions so that each divided region has the same or a similar length between two terminals. In other embodiments, the distribution network 11 may not be divided into several regions evenly. As mentioned above, the number of the sensors can be changed. For other examples, if the number of the sensors is only one, the distribution network 10 is divided into two regions accordingly. If the number of the sensors is more than two, the distribution network 10 is divided into more than three regions accordingly.

Referring to FIG. 2, the fault location evaluation apparatus 19 includes a fault region determination unit 191 used to determine which region is a fault region when a fault occurs therein. The current-voltage sensors 11 and 12 are used to sense current and voltage where they located. The fault location evaluation apparatus 19 calculates the amplitudes of the currents sensed from all current-voltage sensors 11 and 12, to determine the fault region according to the sensed currents based on electrical theory.

Figure 3:
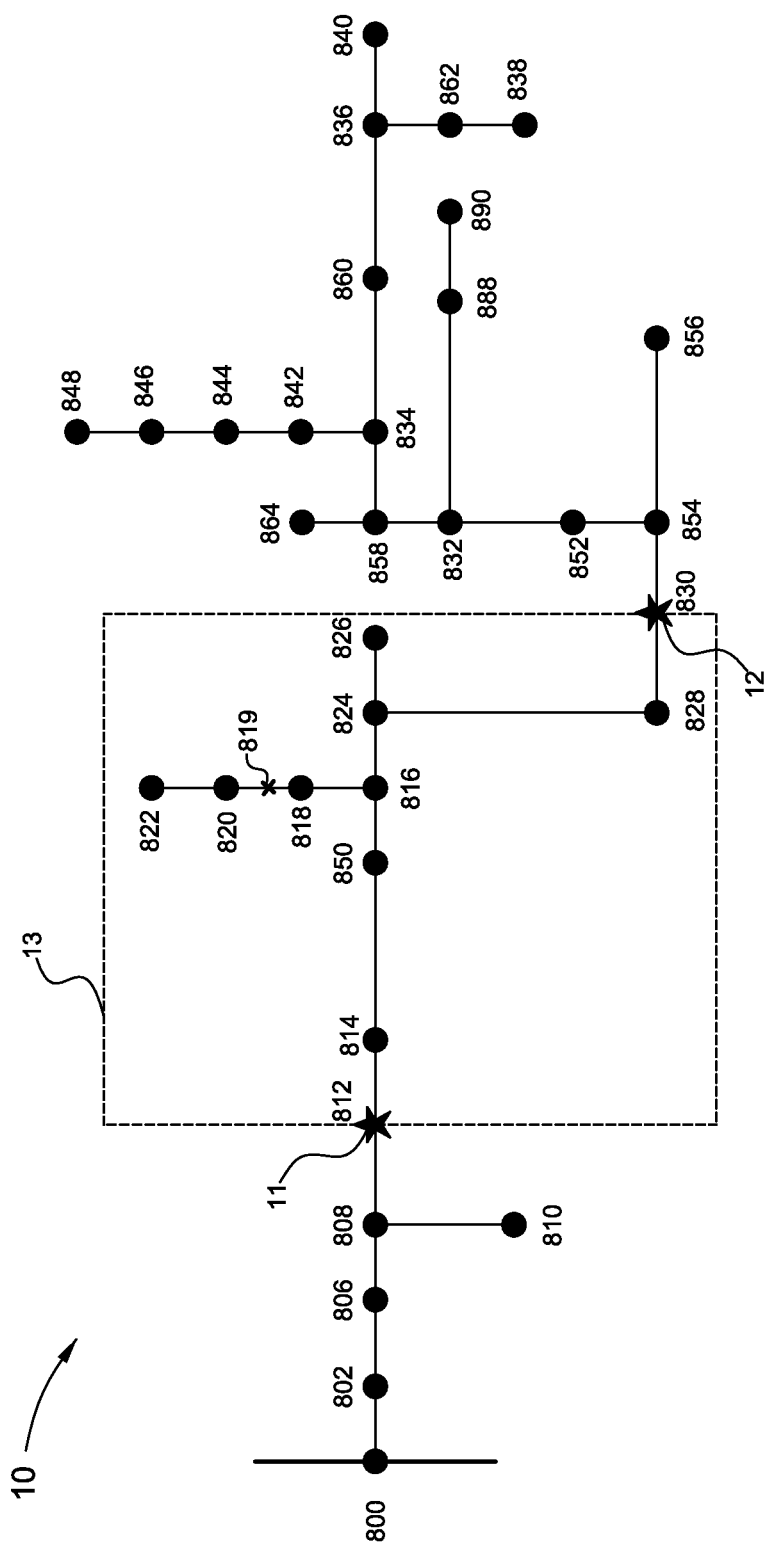
FIG. 3 is a schematic diagram of showing a fault region of the distribution network of FIG. 1.

Referring to FIG. 3, for example, assuming a fault occurs at a fault point 819 in the region 13 between the current-voltage sensor 11 and the current-voltage sensor 12, the current flowing through at the current-voltage sensor 11 will significantly increase after the fault occurs, and the current flowing through at the current-voltage sensor 12 will significant decrease after the fault occurs. It is understood that, considering the sudden change of currents at both nodes 812 and 830, the fault region can be identified according to electrical theory and network topology analysis. In another example, if the current flowing through the current-voltage sensor 11 and the current flowing through the current-voltage sensor 12 both significantly decrease after a fault occurs, that means the fault occurs at the region between node 800 and node 812. In some situations, operators can deal with the fault problem based on the determined fault region. In other situations, after the fault region 13 is determined, some fault location candidates in the corresponding line sections of the fault region 13 are further determined by the fault location evaluation apparatus 19 as discussed below. For another example, if the number of the sensors is only one and the sensor divides the distribution network 10 into a front region and a back region, when the current flowing through the sensor significantly decreases after a fault occurs, that means the fault occurs at the front region, and when the current flowing through the sensor significantly increases after a fault occurs, that means the fault occurs at the back region.

Figure 4:
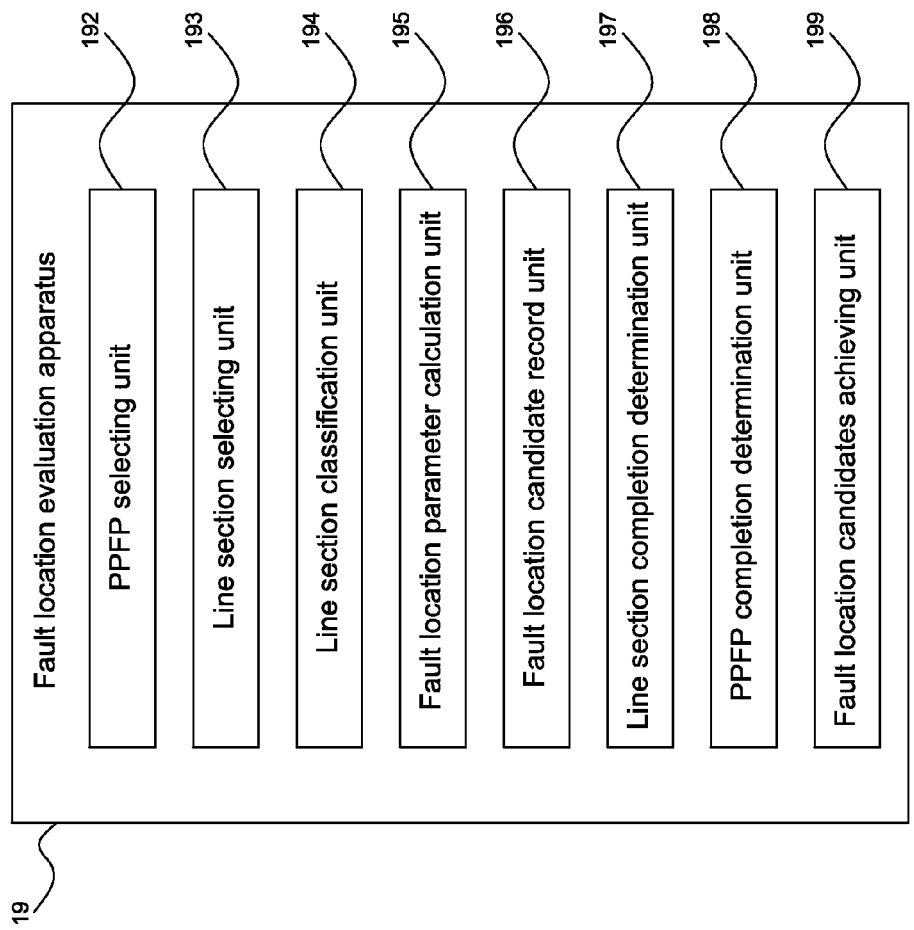
FIG. 4 is a block diagram of a fault location evaluation apparatus of the fault location system of FIG. 2, in accordance with an exemplary embodiment of the present disclosure.

Referring to FIG. 4, for determining fault location candidates, the fault location evaluation apparatus 19 further includes a PPFP selecting unit 192, a line section selecting unit 193, a line section classification unit 194, a fault location parameter calculation unit 195, a fault location candidate record unit 196, a line section completion determination unit 197, a PPFP completion determination unit 198, and a fault location candidates achieving unit 199. In one embodiment, the above units 191-199 of the fault location evaluation apparatus 19 may be situated in discrete units and/or algorithms. In other embodiments, two or more of these units of the fault location evaluation apparatus 19 may be integrated together in a common unit and/or algorithm.

Figure 5:
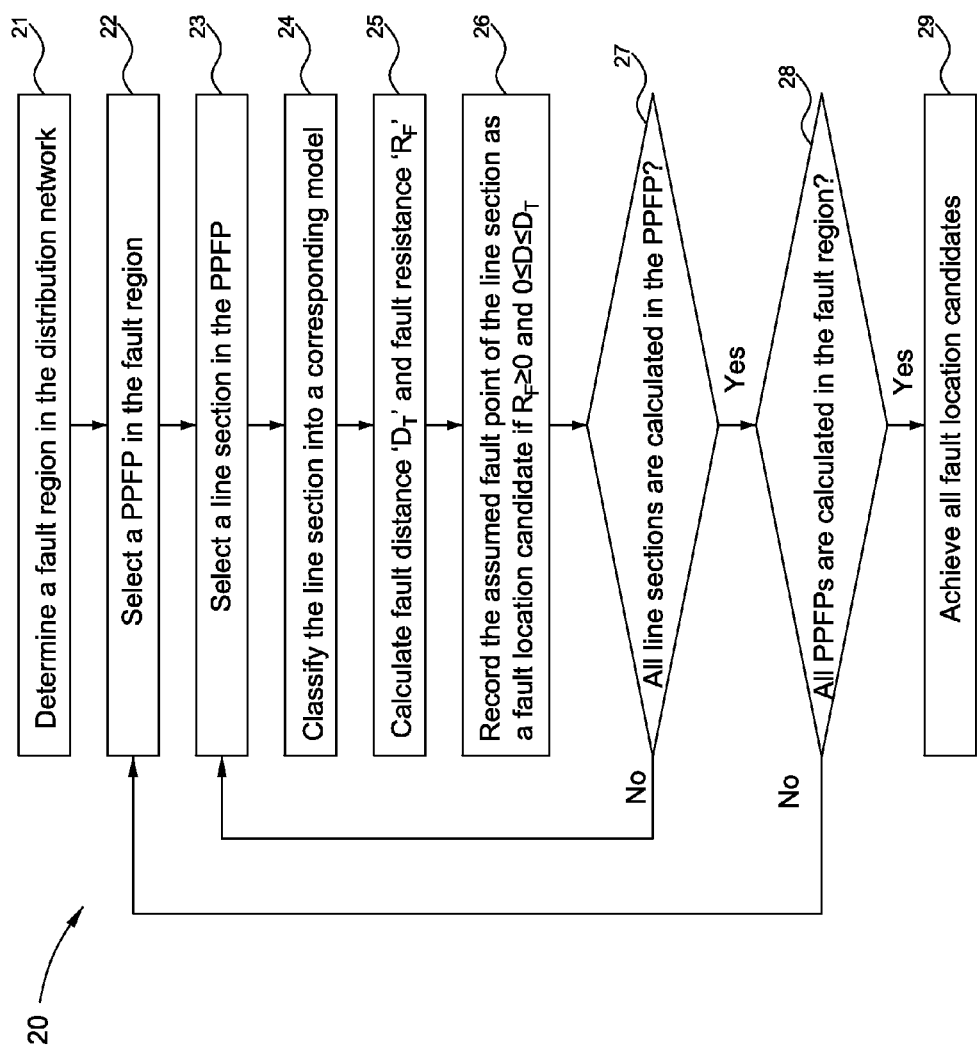
FIG. 5 is a flowchart of a fault location method of the distribution network of FIG. 1, in accordance with an exemplary embodiment of the present disclosure.

Referring to FIG. 5, a flowchart of a fault location method 20 of the distribution network 10 of FIG. 1, in accordance with an exemplary embodiment of the present disclosure is shown. In this illustrated embodiment of FIG. 5, the fault location method 20 includes nine steps 21-29 respectively performed by the units 191-199 of the fault location evaluation apparatus 19.

In step 21, a fault region 13 is determined in the distribution network 10 based on outputs from the current-voltage sensors 11 and 12 mentioned above. After the fault region 13 is determined, all PPFPs in the fault region 13 will be determined accordingly. For example, referring to FIG. 6, there are three PPFPs 14, 15, and 16 determined in the fault region 13. Namely, a first PPFP 14 is from the node 812 to the node 822, a second PPFP 15 is from the node 812 to the node 826, and a third PPFP 16 is from the node 812 to the node 830. Furthermore, each PPFP may include several line sections as shown. For example, the first PPFP 14 includes six line sections, namely a first line section is from the node 812 to the node 814, a second line section is from the node 814 to the node 850, a third line section is from the node 850 to the node 816, a fourth line section is from the node 816 to the node 818, a fifth line section is from the node 818 to the node 820, and a sixth line section is from the node 820 to the node 822.

Based on electrical theory, wherever the location of the actual fault point is located, the line section having the fault point can be classified into a corresponding equivalent fault model for ease of calculation. Eight possible equivalent fault models 61 to 68 are shown in FIGS. 7-14 as an example. A first equivalent fault model 61 represents a fault point 'F' located in a PPFP which has only one current-voltage sensor and has no lateral in the fault region. A second equivalent fault model 62 represents a fault point 'F' located in a PPFP which has two current-voltage sensors and has no lateral in the fault region. A third equivalent fault model 63 represents a fault point 'F' located in a PPFP which has only one current-voltage sensor and has a lateral at upstream of the fault point 'F' in the fault region. A fourth equivalent fault model 64 represents a fault point 'F' located in a PPFP which has two current-voltage sensors and has a lateral at upstream of the fault point 'F' in the fault region. A fifth equivalent fault model 65 represents a fault point 'F' located in a PPFP which has only one current-voltage sensor and has a lateral at downstream of the fault point 'F' in the fault region. A sixth equivalent fault model 66 represents a fault point 'F' located in a PPFP which has two current-voltage sensors and has a lateral at downstream of the fault point 'F' in the fault region. A seventh equivalent fault model 67 represents a fault point 'F' located in a PPFP which has only one current-voltage sensor and has laterals at upstream and downstream of the fault point 'F' in the fault region. An eighth equivalent fault model 68 represents a fault point 'F' located in a PPFP which has two current-voltage sensors and has laterals at upstream and downstream of the fault point 'F' in the fault region.

In other embodiments, the possible equivalent fault models may be changed based on other appropriate model algorithms. For example, the possible equivalent fault models may include only two categories: a fault point between two or more sensors (with one upstream sensor and one or more downstream sensors), and a fault point with only one upstream sensor for example.

For ease of explanation, in FIGS. 7-14, 'L' denotes a left point where a current-voltage sensor is located. 'R' denotes a right point where another current-voltage sensor may be located. 'F' is a fault point where a fault occurs. '$V_L$' denotes the voltage at the point 'L'. '$I_L$' denotes the current flowing from the left point 'L'. 'D' denotes a fault distance from a beginning node of the line section to the fault point 'F'. '$D_T$' denotes a total line length of the line section. '$Z_L$' denotes a line impedance of unit length. Thus, 'D×$Z_L$' denotes the line impedance from the beginning node of the line section to the fault point 'F'. '$R_F$' denotes a fault resistance of the fault point 'F' to ground. '$I_R$' denotes the current value flowing from the right point 'R'. '$Z_E$' denotes an equivalent resistance of the right point 'R' to ground. 'M' denotes one terminal of the line section. 'H' denotes another terminal of the line section. '$Z_{LM}$' denotes a line impedance between the left point 'L' and the point 'M'. '$Z_{MR}$' denotes a line impedance between the right point 'R' and the point 'M'. '$I_M$' denotes the current value flowing from the point 'M'. '$Z_{load}$' and '$Z_{load\_M}$' each denotes an equivalent resistance of the point 'M' to ground. '$Z_{LH}$' denotes a line impedance between the left point 'L' and the point 'H'. '$I_H$' denotes the current value flowing from the point 'H'. '$Z_{load\_H}$' denotes an equivalent resistance of the point 'H' to ground.

In step 22, a PPFP in the fault region 13 is selected. For example, FIG. 15 is an embodiment where the first PPFP 14 is selected first. In other embodiments, the second PPFP 15 or the third PPFP 16 may be selected first according to different programing designs.

In step 23, a line section in the selected PPFP 14 is selected. For example, FIG. 15 shows that a line section 141 between the node 816 and the node 818 is selected first. In other embodiments, any one of the other line sections, such as the line section between the node 850 and the node 816, may be selected first according to different programing designs.

In step 24, the selected line section 141 is classified into a corresponding one of the predetermined equivalent fault models 61-68. Referring to FIG. 16, assuming there is a fault point 817 located in the line section 141, the selected line section 141 (also the assumed fault point 817) can be classified into the third equivalent fault model 63 due to the assumed fault point 817 is located in the first PPFP 14 which has only one current-voltage sensor 11 and has a lateral (the lateral from node 816 to 824) at upstream of the fault point 'F' in the fault region 13. In the third equivalent fault model 63 corresponding to the selected line section 141, the point 1' denotes the sensor 11, the point 'M' denotes the beginning node 816 of the line section 141, the point 'F' denotes the assumed fault point 817, '$R_F$' denotes a fault resistance of the fault point 'F' to ground, the point 'R' denotes the other node 818 of the line section 141, '$Z_{LM}$' denotes a line impedance between the point 'L' and the point 'M', '$Z_{load}$' denotes an equivalent resistance of the point 'M' to ground, '$Z_E$' denotes an equivalent resistance of the point 'R' to ground, 'D' denotes a fault distance from the beginning node 816 to the fault point 817 of the line section 141. '$D_T$' denotes a total line length of the line section 141. '$Z_L$' denotes a line impedance of unit length. In other situations, when the assumed fault point is located in any other line section, the assumed fault point can be classified into a corresponding equivalent fault model according to similar methods, thus not described.

In step 25, after the corresponding equivalent fault model is determined for the selected line section, the corresponding fault distance 'D' and fault resistance '$R_F$' are calculated based on the equivalent fault model and electrical theory. For example, when the selected line section 141 is the PPFP 14 shown in FIG. 16, the corresponding equivalent fault model is the third equivalent fault model 63 as mentioned above. According to the Ohm's law equation, there are two equations:

$$V_M = V_L - Z_{LM} I_L \tag{1}$$

$$I_M = I_L - (V_L - Z_{LM} I_L)/Z_{Load} \tag{2}$$

With the assumption that the fault is resistive, the equations (1) and (2) can be reduced to a quadratic equation with respect to the fault distance 'D', and therefore the fault distance 'D' and the corresponding fault resistance '$R_F$' can be solved as:

$$D = [-b \pm \sqrt{(b^2 - 4ac)}]/2a \tag{3}$$

$$R_F = (V_M - D \times Z_L \times I_M)[(D_T - D) \times Z_L + Z_E]/[I_M \times (D_T \times Z_L + Z_E) - V_M] \tag{4}$$

where, $$a = Im[Z_L^2 \times (D_T \times Z_L + Z_E - V_M/I_M)^*] \tag{5}$$

$$b = Im[-Z_L \times (D_T \times Z_L + Z_E + V_M/I_M) \times (D_T \times Z_L + Z_E - V_M/I_M)^*] \tag{6}$$

$$c = Im[(V_M/I_M) \times (D_T \times Z_L + Z_E) \times (D_T \times Z_L + Z_E - V_M/I_M)^*] \tag{7}$$

where, 'Im[. . . ]' denotes the imaginary part of a complex number, and '*' denotes the complexconjugate. Two solutions of 'D' (and thus '$R_F$') are given in equation (2). But, the negative oneof the two solutions of 'D' and the corresponding '$R_F$' is discarded. The voltage and current '$V_L$' and '$I_L$' are sensed by the sensor 11, the other parameters '$D_T$', '$Z_{LM}$', '$Z_E$', '$Z_{Load}$' aredetermined in advance. It is understood that, other equivalent fault models 61, 62, 64-68 alsocan be used to calculate the corresponding fault distance 'D' and fault resistance '$R_F$' based onOhm's law equation, and thus these are not described.

In step 26, after the fault distance 'D' and fault resistance '$R_F$' are calculated, it isdetermined whether the fault distance 'D' is equal to or greater than zero and equal to or lessthan the total line length '$D_T$' of the line section 141 and whether the fault resistance '$R_F$' isequal to or greater than zero. If the calculated fault distance 'D' and fault resistance '$R_F$' meetabove two conditions, the assumed fault point 817 is recorded as a fault location candidate.

In step 27, the line section completion determination unit 197 determines whether all line sections are calculated in the corresponding PPFP. If yes, the process goes to step 28, if no, the process goes back to step 23 until all line sections in the PPFP are calculated.

In step 28, the PPFP completion determination unit 198 determines whether all PPFPs are calculated in the fault region 13. If yes, the process goes to step 29, if no, the process goes back to step 22 until all PPFPs in the fault region 13 are calculated.

If step 29, after all line sections in all PPFPs are calculated, all fault location candidates are determined accordingly. For example, in the embodiment of FIG. 17, after all line sections in all PPFPs are calculated, two fault location candidates 817 and 825 are determined to meet the above two conditions of the fault distance 'D' and fault resistance '$R_F$'. The fault location candidate 817 is located in a line section 141, and the fault location candidate 825 is located in a line section 151 in this example.

After above selecting process, in most cases it is expected that either one or a small number of the large number of line sections in the distribution network 10 will be reported as fault location candidates. In some statuses, the operator can perform some recovery operations to deal with the fault problem based on the few fault candidate locations. In some situations, the operators can quickly recover the fault problem due to they only need to check a few fault candidate locations, sometime only need to check one fault candidate location. Therefore, the recovery process based on only a few fault candidate locations is more simplified and more efficient than conventional recovery process based on a large number of fault candidate locations. For example, in a conventional recovery process, when a fault occurs, the operators may need to turn off the power first and then rely on manual line check to a large number of line sections one by one until they find the actual fault location on a corresponding line section. The conventional recovery process may need to take extensive labor cost and long examination time. However, by using the fault location system 18 of this invention, one or a small number of fault location candidates can be automatically determined which can help the operators to do the recovery process very fast with high accuracy.

In some embodiments, the steps 22 and 28 may be omitted, and the selected line sections in the fault region are calculated one by one based on corresponding equivalent fault models and the whole topology configuration of the fault region. In some embodiments, only one step 21 is enough to narrow possible positions of the fault position. For example, when the distribution network 10 is quite short and many current sensors are arranged on different nodes of the distribution network 10, each divided region is quite small, which is enough to deal with the fault problem after the fault region is determined by calculating the sensed currents from the current sensors.

In some conditions, some line sections may belong to two or more PPFPs. For example, the line section from node 816 to node 824 belongs to the three PPFPs 14, 15, and 16 shown in FIG. 6. In practice, if a fault occurs in such a line section, the fault distances 'D' computed through multiple PPFPs are very close. Therefore, we may either calculate fault distances 'D' from all the related PPFPs, and then calculate the average value as the final fault distance 'D' in this line section, or we may select any one of these related PPFPs and calculate the fault distance as the final value. The selection of either approach depends on the calculation burden and time requirements, for example.

Referring to FIG. 18, a simulation diagram showing fault location accuracy of the fault location system 18 is shown. In FIG. 18, the fault distance is the distance between the original point and the fault point of the distribution network 10. This simulation diagram shows four different fault resistances conditions, which includes $R_F$=0 Ohm, $R_F$=10 Ohm, $R_F$=30 Ohm, $R_F$=50 Ohm. When $R_F$=0 Ohm, the fault location accuracy is very high which falls in about 5-100 m.

Further, even when $R_F$=50 Ohm, the fault location accuracy is also in a high level which falls in about 60-520 m. Those simulated fault location accuracy all satisfy accuracy requirements.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A fault location system for a distribution network, the fault location system comprising:
    at least one sensor located on the distribution network, for sensing current and voltage; and
    a fault location evaluation apparatus comprising:
        a possible power flow path (PPFP) selecting unit for selecting PPFPs one by one in the distribution network;
        a line section selecting unit for selecting line sections one by one in each of the selected PPFPs;
        a line section classification unit for classifying each of the selected line sections into a corresponding equivalent fault model based on the selected PPFP;
        a fault location parameter calculation unit for calculating a fault distance 'D' and a fault resistance '$R_F$' of an assumed fault point of each of the selected line sections based on the corresponding equivalent fault model;
        a fault location candidate record unit for recording the assumed fault points as fault location candidates if $R_F \geq 0$ and $0 \leq D \leq D_T$, wherein 'DT' is the total length of the corresponding line section.

2. The fault location system of claim 1 wherein the fault distance 'D' is an average value of at least two calculated fault distances 'D' if the corresponding line section belongs to at least two PPFPs.

3. The fault location system of claim 1, wherein the equivalent fault model comprises at least one sensor point, a fault point, a fault resistance, and line impedances corresponding to different line sections.

4. The fault location system of claim 3, wherein the fault distance 'D' and the fault resistance '$R_F$' are calculated based on an Ohm's law equation, the sensed current and voltage from the at least one sensor, and predetermined parameters in the corresponding equivalent fault model.

5. The fault location system of claim 1, wherein the at least one sensor evenly divides the distribution network into the at least two regions.

6. A fault location method for a distribution network, the fault location method comprising:
    sensing current and voltage on at least one position of the distribution network using at least one sensor;
    selecting possible current power flow paths (PPFPs) one by one in the distribution network;
    selecting line selections one by one in each of the selected PPFPs;
    classifying each of the selected line sections into a corresponding equivalent fault model based on the selected PPFP;
    calculating a fault distance 'D' and a fault resistance '$R_F$' of an assumed fault point of each of the selected line sections based on the corresponding equivalent fault model; and
    recording the assumed fault points as fault location candidates if fault location candidates if $R_F \geq 0$ and $0 \leq D \leq D_T$, wherein '$D_T$' is the total length of the corresponding line section.

7. The fault location method of claim 6, wherein the fault distance 'D' is an average value of at least two calculated fault distances 'D' if the corresponding line section belongs to at least two PPFPs.

8. The fault location method of claim 6, wherein the equivalent fault model comprises at least one sensor point, a fault point, a fault resistance, and line impedances corresponding to different line sections.

9. The fault location method of claim 8, wherein the fault distance 'D' and the fault resistance 'RF' are calculated based on an Ohm's law equation, the sensed current and voltage, and predetermined parameters in the corresponding equivalent fault model.

10. The fault location method of claim 6, wherein the at least one position evenly divides the distribution network into the at least two regions.

* * * * *

UNITED STATES PATENT AND TRADEMARK OFFICE
CERTIFICATE OF CORRECTION

PATENT NO.       : 9,442,152 B2                                        Page 1 of 3
APPLICATION NO.  : 14/458350
DATED            : September 13, 2016
INVENTOR(S)      : Wu et al.

It is certified that error appears in the above-identified patent and that said Letters Patent is hereby corrected as shown below:

On the Title Page

In Item (72), under "Inventors", in Column 1, Line 1, delete "ShangHai" and insert -- Shanghai --, therefor.

In the Drawings

In Fig. 5, Sheet 5 of 18, in Step "25", Line 1, delete "'$D_T$'" and insert -- 'D' --, therefor.

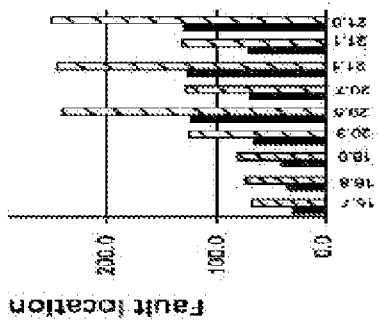

In Fig. 18, Sheet 18 of 18, delete " 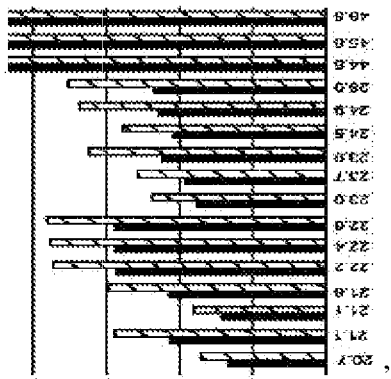 "

Signed and Sealed this
Twenty-first Day of February, 2017

Michelle K. Lee
*Director of the United States Patent and Trademark Office* and insert -- 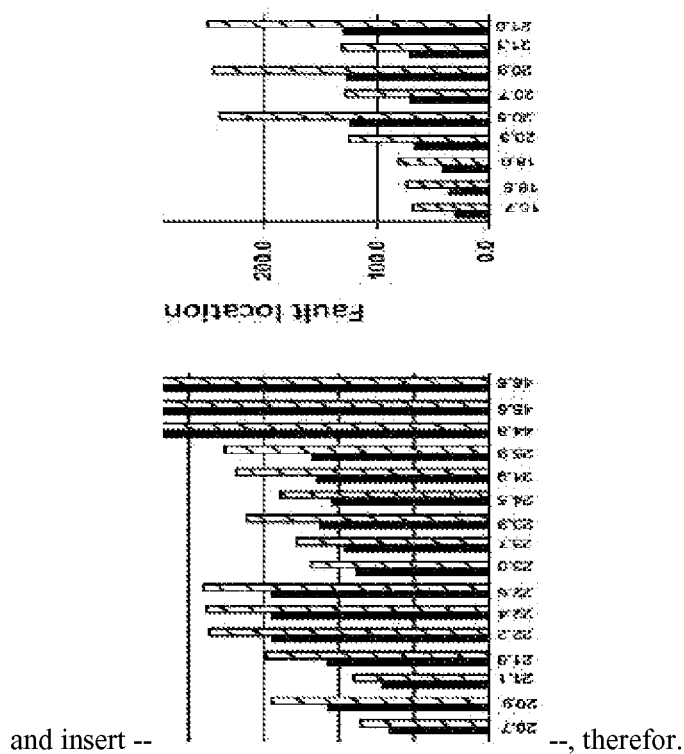 --, therefor.

In Fig. 18, Sheet 18 of 18, delete "180,0" and insert -- 180.0 --, therefor.

In the Specification

In Column 4, Line 24, delete "distribution network 11" and insert -- distribution network 10 --, therefor.

In Column 4, Line 27, delete "distribution network 11" and insert -- distribution network 10 --, therefor.

In Column 6, Line 62, delete "1'" and insert -- 'L' --, therefor.

In Column 7, Line 43, delete "complexconjugate." and insert -- complex conjugate. --, therefor.

In Column 7, Line 45, delete "oneof" and insert -- one of --, therefor.

In Column 7, Line 48, delete "aredetermined" and insert -- are determined --, therefor.

In Column 7, Line 50, delete "alsocan" and insert -- also can --, therefor.

In Column 7, Line 51, delete "onOhm's" and insert -- on Ohm's --, therefor.

In Column 7, Line 54, delete "isdetermined" and insert -- is determined --, therefor.

CERTIFICATE OF CORRECTION (continued)
U.S. Pat. No. 9,442,152 B2

In Column 7, Line 56, delete "lessthan" and insert -- less than --, therefor.

In Column 7, Line 57, delete "isequal" and insert -- is equal --, therefor.

In Column 7, Line 59, delete "meetabove" and insert -- meet above --, therefor.

In the Claims

In Column 9, Line 37, in Claim 1, delete "'DT'" and insert -- '$D_T$' --, therefor.

In Column 10, Lines 25-26, in Claim 6, delete "as fault location candidates if fault location candidates" and insert -- as fault location candidates --, therefor.

In Column 10, Line 38, in Claim 9, delete "'RF'" and insert -- '$R_F$' --, therefor.